United States Patent
Asano et al.

(10) Patent No.: US 11,651,118 B2
(45) Date of Patent: May 16, 2023

(54) SIMULATION METHOD, SIMULATION APPARATUS, AND STORAGE MEDIUM

(71) Applicant: CANON KABUSHIKI KAISHA, Tokyo (JP)

(72) Inventors: Tosiya Asano, Utsunomiya (JP); Junichi Seki, Kawasaki (JP); Yuichiro Oguchi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 241 days.

(21) Appl. No.: 16/896,587

(22) Filed: Jun. 9, 2020

(65) Prior Publication Data

US 2020/0394346 A1   Dec. 17, 2020

(30) Foreign Application Priority Data

Jun. 11, 2019  (JP) .............................. JP2019-109022

(51) Int. Cl.
*G06F 30/20* (2020.01)
*B29C 59/02* (2006.01)
*G03F 7/00* (2006.01)

(52) U.S. Cl.
CPC ............ *G06F 30/20* (2020.01); *B29C 59/026* (2013.01); *G03F 7/0002* (2013.01)

(58) Field of Classification Search
CPC .................. G06F 30/20; B29C 2037/90; B29C 2037/903
See application file for complete search history.

(56) References Cited

U.S. PATENT DOCUMENTS

| 9,201,990 B2 | 12/2015 | Wakamatsu |
| 2013/0249981 A1* | 9/2013 | Nakagawa ............ G03F 7/0002 347/9 |
| 2014/0131313 A1* | 5/2014 | Wakamatsu ............ G06F 30/20 703/2 |

FOREIGN PATENT DOCUMENTS

| JP | 5599356 B2 | 10/2014 |
| JP | 2017117979 A | 6/2017 |

OTHER PUBLICATIONS

Extended European Search Report issued in European Appln. No. 20179223.1 dated Oct. 28, 2020.

* cited by examiner

*Primary Examiner* — Austin Murata
(74) *Attorney, Agent, or Firm* — Rossi, Kimms & McDowell LLP

(57) ABSTRACT

There is provided a simulation method of predicting a behavior of a curable composition in a process of bringing a plurality of droplets of the curable composition arranged on one of a first member and a second member into contact with an other of the first member and the second member and forming a film of the curable composition on the first member. The method includes generating a link by connecting two adjacent representative points of the plurality of droplets, generating a cell as a closed region formed by a plurality of links, and determining, based on the presence/absence of merging of droplets corresponding to each link forming the cell, whether a bubble is formed in the cell.

13 Claims, 12 Drawing Sheets

FIG. 1
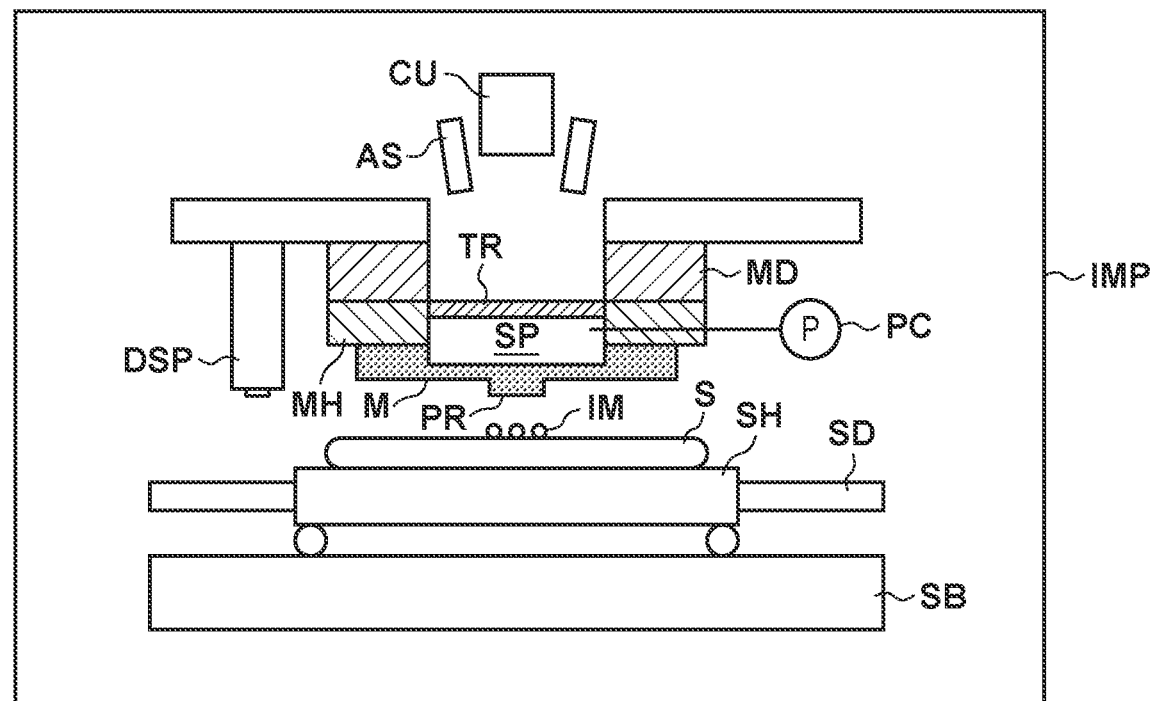
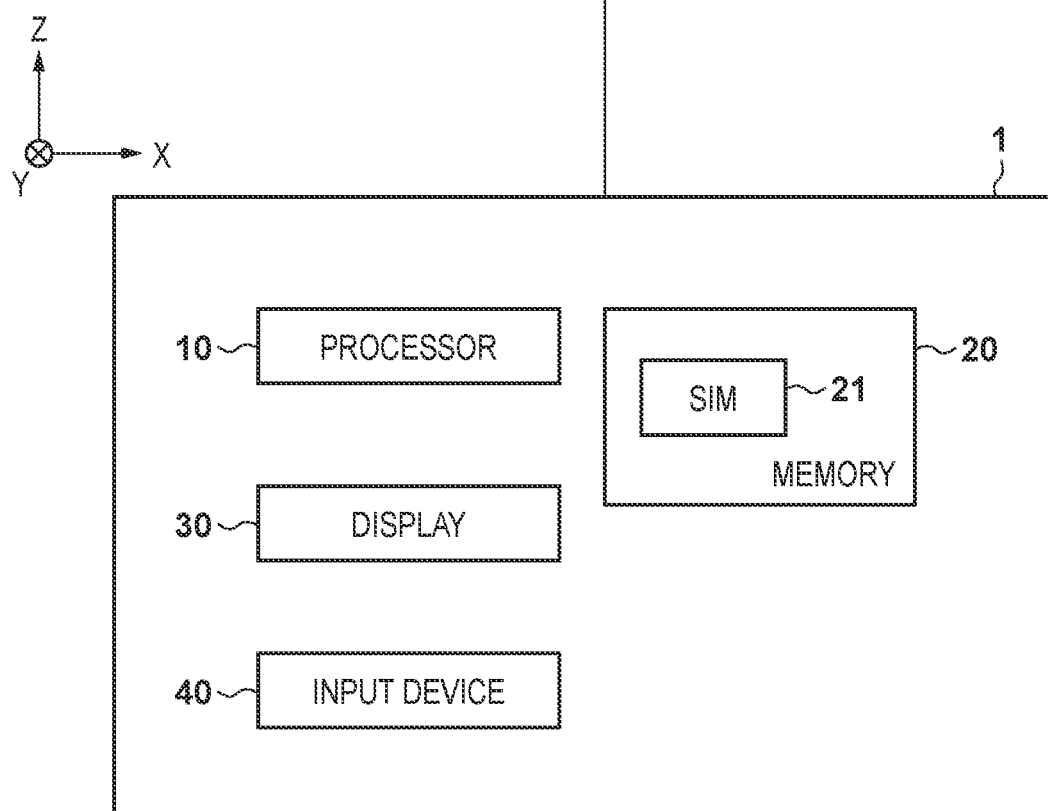

OBTUSE TRIANGULAR CELL

OPEN LINK

TWO NON-MERGED DROPLETS

CLOSED LINK

TWO MERGED DROPLETS

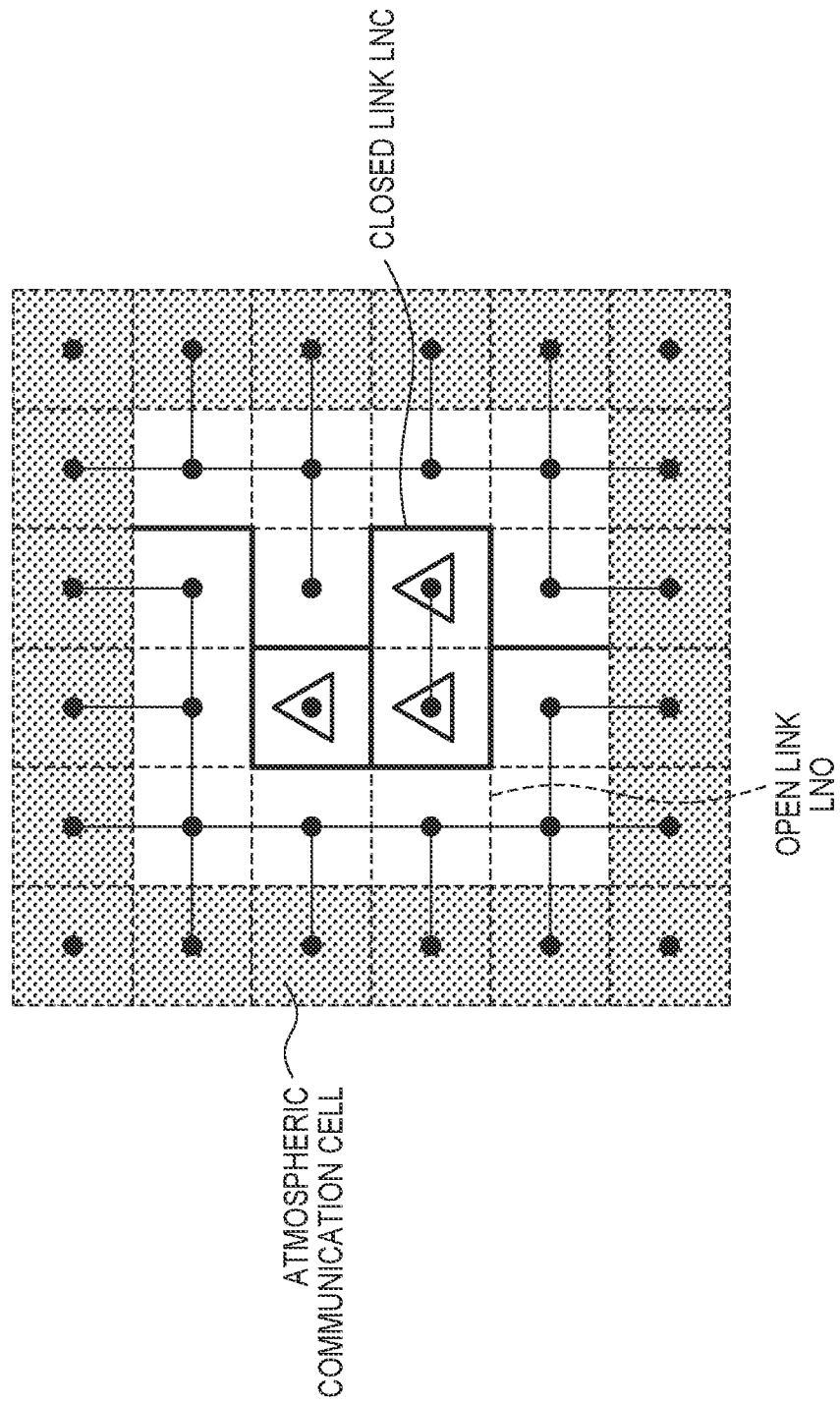

SIMULATION METHOD, SIMULATION APPARATUS, AND STORAGE MEDIUM

BACKGROUND OF THE INVENTION

Field of the Invention

The present invention relates to a simulation method, a simulation apparatus, and a storage medium. The present invention further relates to a film forming method and a method of producing a cured product.

Description of the Related Art

There is provided a film forming method of forming a film made of a cured product of a curable composition on a substrate by arranging the curable composition on the substrate, bringing the curable composition into contact with a mold, and curing the curable composition. This film forming method can be applied to an imprint method, a planarization method, and the like. In the imprint method, using a mold having a pattern, the pattern of the mold is transferred to a curable composition on a substrate. In the planarization technique, using a mold having a flat surface, a film having a flat upper surface is formed by bringing a curable composition on a substrate into contact with the flat surface and curing the curable composition.

The curable composition can be arranged in the form of droplets on the substrate. After that, the mold can be pressed against the droplets of the curable composition on the substrate. This spreads the droplets to form a film of the curable composition. In this process, it is important to form a film of the curable composition with a uniform thickness and not to include bubbles in the film. To achieve them, the arrangement of the droplets, a method and a condition for pressing the mold against the droplets, and the like can be adjusted. To implement this adjustment operation by trial and error including film formation using a film forming apparatus, enormous time and cost are required. To cope with this, it is desired that a simulator that supports such adjustment operation appears.

Japanese Patent No. 5599356 describes a simulation method for predicting wet spreading and merging of a plurality of droplets arranged on a pattern forming surface. In this simulation method, an analysis surface obtained by modeling the pattern forming surface is divided into a plurality of analysis cells, and a droplet is arranged for each drop site on the analysis surface. Japanese Patent No. 5599356 describes that the drop sites are defined as regions obtained by dividing the surface into an m×n grid pattern, and are based on a concept different from that of the analysis cells.

Normally, when the behaviors of droplets are computed, it is necessary to define computational components (analysis cells) each sufficiently smaller than the dimensions (size) of each droplet. However, computation of the behaviors of droplets over the entire wide region such as one shot region while defining such small computational components is extremely unrealistic, and it may be impossible to obtain a computation result within an allowable time. Especially, a plurality of droplets on the computational components (computational grid) conventionally represent trapping of a bubble. However, since the number of computational grids is enormous, solving within a realistic time is impossible.

SUMMARY OF THE INVENTION

The present invention provides a technique advantageous in computing, within a shorter time, the behavior of a curable composition in a process of forming a film of the curable composition. Especially, the present invention provides a technique advantageous in terms of a calculation amount with respect to representation of a bubble among droplets of the curable composition.

The present invention in its one aspect provides a simulation method of predicting a behavior of a curable composition in a process of bringing a plurality of droplets of the curable composition arranged on one of a first member and a second member into contact with an other of the first member and the second member and forming a film of the curable composition on the first member, the method comprising generating a link by connecting two adjacent representative points of the plurality of droplets, generating a cell as a closed region formed by a plurality of links, and determining, based on the presence/absence of merging of droplets corresponding to each link forming the cell, whether a bubble is formed in the cell.

Further features of the present invention will become apparent from the following description of exemplary embodiments (with reference to the attached drawings).

BRIEF DESCRIPTION OF THE DRAWINGS

FIG. 1 is a view showing the arrangement of a simulation apparatus according to the first embodiment;

FIG. 15 is a view for explaining a method of determining trapping of a bubble.

DESCRIPTION OF THE EMBODIMENTS

Figure 2:
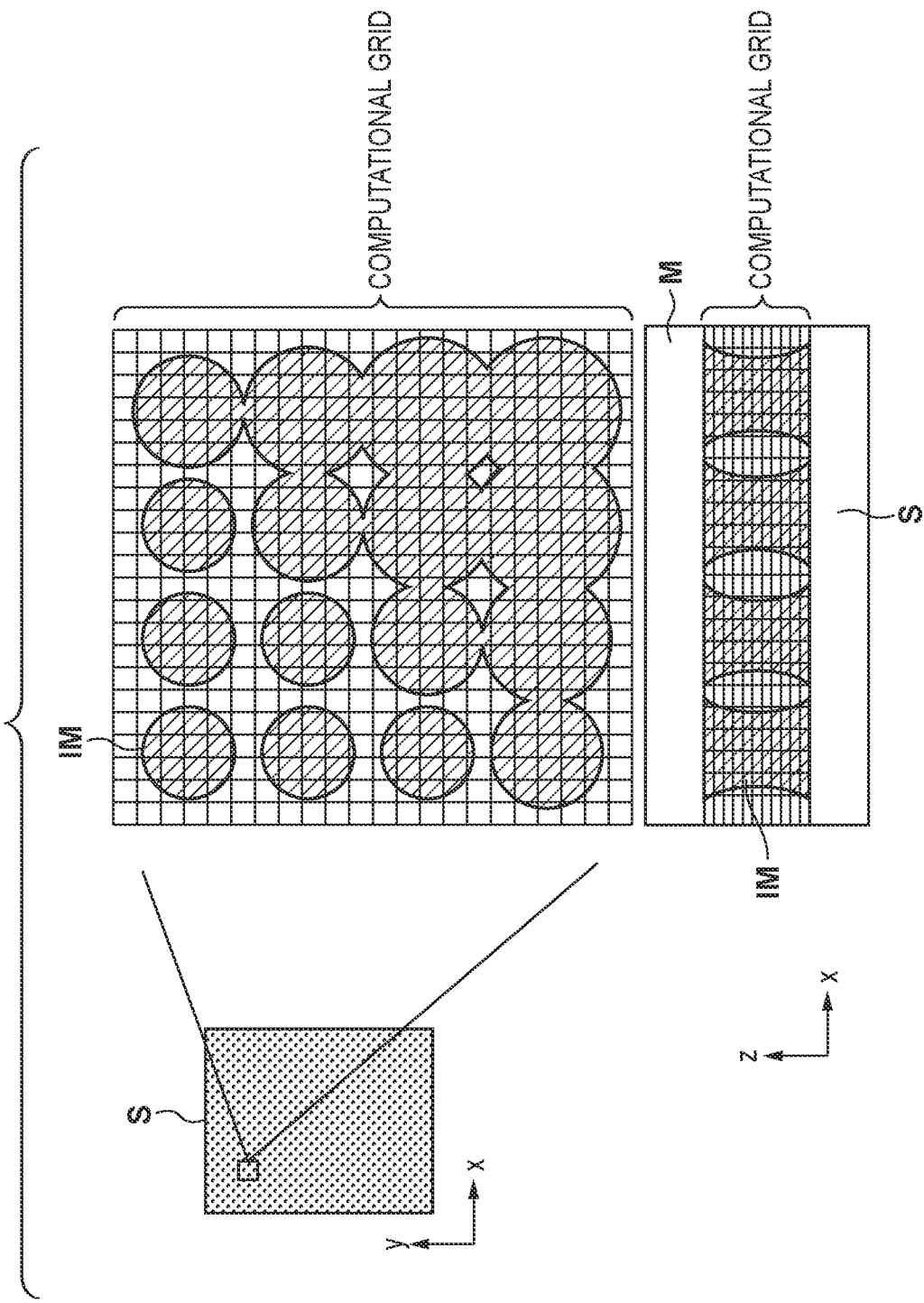
FIG. 2 is a view showing an example of a computational grid according to a conventional technique.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached draw-

First Embodiment

FIG. 1 shows the arrangements of a film forming apparatus IMP and a simulation apparatus 1 according to an embodiment. The film forming apparatus IMP executes a process of bringing a plurality of droplets of a curable composition IM arranged on a substrate S into contact with a mold M, and forming a film of the curable composition IM in a space between the substrate S and the mold M. The film forming apparatus IMP may be formed as, for example, an imprint apparatus or a planarization apparatus. The substrate S and the mold M are interchangeable, and a film of the curable composition IM may be formed in the space between the mold M and the substrate S by bringing a plurality of droplets of the curable composition IM arranged on the mold M into contact with the substrate S. Therefore, the film forming apparatus IMP is more comprehensively an apparatus that executes a process of bringing a plurality of droplets of the curable composition IM arranged on one of the first member and the second member into contact with the other of the first member and the second member and forming a film of the curable composition IM on the first member. An example in which the first member is the substrate S and the second member is the mold M will be described below. However, the first member may be assumed as the mold M and the second member may be assumed as the substrate S. In this case, the substrate S and the mold M in the following description are interchanged.

The imprint apparatus can use the mold M having a pattern to transfer the pattern of the mold M to the curable composition IM on the substrate S. The imprint apparatus can use the mold M having a pattern region PR provided with a pattern. The imprint apparatus can bring the curable composition IM on the substrate S into contact with the pattern region PR of the mold M, fill, with the curable composition, a space between the mold M and a region where the pattern of the substrate S is to be formed, and then cure the curable composition IM. This transfers the pattern of the pattern region PR of the mold M to the curable composition IM on the substrate S. For example, the imprint apparatus can form a pattern made of a cured product of the curable composition IM in each of a plurality of shot regions of the substrate S.

Using the mold M having a flat surface, the planarization apparatus can bring the curable composition IM on the substrate S into contact with the flat surface, and cure the curable composition IM, thereby forming a film having a flat upper surface. The planarization apparatus can normally use the mold M having a size that can cover the entire region of the substrate S to form a film made of a cured product of the curable composition IM on the entire region of the substrate S.

As the curable composition, a material to be cured by receiving curing energy can be used. As the curing energy, an electromagnetic wave or heat can be used. The electromagnetic wave can be, for example, light selected from the wavelength range of 10 nm (inclusive) to 1 mm (inclusive) and, more specifically, infrared light, a visible light beam, or ultraviolet light. The curable composition can be a composition cured by light irradiation or heating. A photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The viscosity (the viscosity at 25° C.) of the curable composition can be, for example, 1 mPa·s (inclusive) to 100 mPa·s (inclusive). As the material of the substrate, for example, glass, a ceramic, a metal, a semiconductor, a resin, or the like can be used. A member made of a material different from the substrate may be provided on the surface of the substrate, as needed. The substrate is, for example, a silicon wafer, a compound semiconductor wafer, or silica glass.

In the specification and the accompanying drawings, directions will be indicated on an XYZ coordinate system in which directions parallel to the surface of the substrate S are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes. Positioning means controlling the position and/or orientation.

The film forming apparatus IMP can include a substrate holder SH that holds the substrate S, a substrate driving mechanism SD that drives the substrate S by driving the substrate holder SH, and a support base SB that supports the substrate driving mechanism SD. In addition, the film forming apparatus IMP can include a mold holder MH that holds the mold M and a mold driving mechanism MD that drives the mold M by driving the mold holder MH. The substrate driving mechanism SD and the mold driving mechanism MD can form a relative driving mechanism that drives at least one of the substrate holder SH and the mold holder MH so as to adjust the relative position between the substrate S and the mold M. Adjustment of the relative position by the relative driving mechanism can include contact of the mold M with the curable composition IM on the substrate S and driving to separate the mold M from the cured curable composition IM. In addition, adjustment of the relative position by the relative driving mechanism can include positioning between the substrate S and the mold M. The substrate driving mechanism SD can be configured to drive the substrate S with respect to a plurality of axes (for example, three axes including the X-axis, Y-axis, and θZ-axis, and preferably six axes including the X-axis, Y-axis, Z-axis, θX-axis, θY-axis, and θZ-axis). The mold driving mechanism MD can be configured to drive the mold M with respect to a plurality of axes (for example, three axes including the Z-axis, θX-axis, and θY-axis, and preferably six axes including the X-axis, Y-axis, Z-axis, θX-axis, θY-axis, and θZ-axis).

The film forming apparatus IMP can include a curing unit CU for curing the curable composition IM with which the space between the substrate S and the mold M is filled. For example, the curing unit CU can irradiate the curable composition IM with the curing energy via the mold M, thereby curing the curable composition IM. The film forming apparatus IMP can include a transmissive member TR for forming a space SP on the rear side (the opposite side of a surface opposing the substrate S) of the mold M. The transmissive member TR is made of a material that transmits the curing energy from the curing unit CU, thereby making it possible to irradiate the curable composition IM with the curing energy. The film forming apparatus IMP can include a pressure control unit PC that controls deformation of the mold M in the Z-axis direction by controlling the pressure of the space SP. For example, when the pressure control unit PC makes the pressure of the space SP higher than the atmospheric pressure, the mold M can be deformed in a convex shape toward the substrate S.

The film forming apparatus IMP can include a dispenser DSP for arranging, supplying, or distributing the curable composition IM on the substrate S. The substrate S on which the curable composition IM is arranged by another apparatus may be supplied to the film forming apparatus IMP. In this case, the film forming apparatus IMP need not include the dispenser DSP. The film forming apparatus IMP may include an alignment scope AS for measuring an alignment error between the substrate S (or the shot region of the substrate S) and the mold M.

The simulation apparatus 1 can execute computation of predicting the behavior of the curable composition IM in a process executed by the film forming apparatus IMP. More specifically, the simulation apparatus 1 can execute computation of predicting the behavior of the curable composition IM in the process of bringing the plurality of droplets of the curable composition IM arranged on the substrate S into contact with the mold M and forming a film of the curable composition IM in the space between the substrate S and the mold M.

The simulation apparatus 1 can be formed by, for example, incorporating a simulation program 21 in a general-purpose or dedicated computer. Alternatively, the simulation apparatus 1 can be formed by a PLD (the abbreviation of a Programmable Logic Device) such as an FPGA (the abbreviation of a Field Programmable Gate Array) or an ASIC (the abbreviation of an Application Specific Integrated Circuit). In one example, the simulation apparatus 1 can be formed by preparing a computer including a processor 10, a memory 20, a display 30, and an input device 40 and storing the simulation program 21 in the memory 20. The memory 20 may be a semiconductor memory, a disk such as a hard disk, or a memory of another form. The simulation program 21 may be stored in a computer-readable memory medium or provided to the simulation apparatus 1 via a communication facility such as a telecommunication network.

FIG. 2 exemplifies a computational grid that can be defined when simulating the behavior of the curable composition IM between the substrate S and the mold M by a general method. In this specification, the computational grid is an aggregate of computational components as minimum units for computation. Referring to FIG. 2, each of a plurality of small rectangles arranged to form a grid is a computational component. A computational grid is defined in an analysis target region (for example, a shot region) of the substrate S. In a normal simulation method, the ratio of the volume of the curable composition IM to the volume of each computational component can be represented. To analyze the behaviors of the droplets of the curable composition IM, a computational grid formed by computational components each sufficiently smaller than the dimensions of each droplet will be defined. If, for example, a liquid film of the curable composition having a film thickness of around several tens of nm is to be formed by applying several-PL droplets to a region of 26 mm×33 mm as the standard angle of view in semiconductor manufacturing, several tens of thousands of droplets are dealt with at the same time. Therefore, if a computational grid formed by the above-described small computational components is defined, the computation amount is enormous, and it cannot be expected to obtain a computation result within an allowable time.

Figure 3:
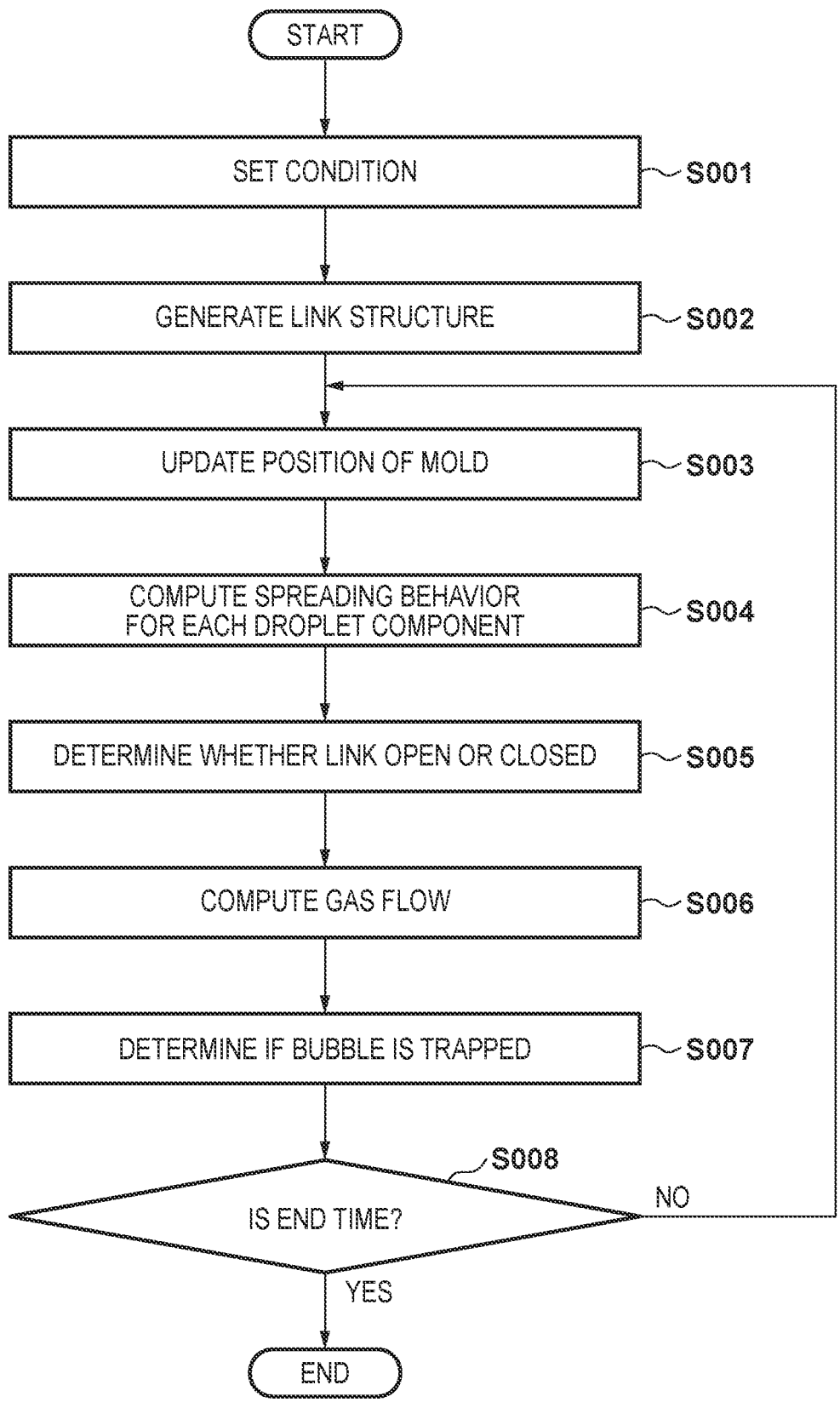
FIG. 3 is a flowchart illustrating a simulation method according to the embodiment.

A simulation method executed by the simulation apparatus 1 will be described below with reference to a flowchart shown in FIG. 3. A program corresponding to this flowchart is included in the simulation program 21, and is executed by the processor 10. This simulation method can include steps S001, S002, S003, S004, S005, S006, S007, and S008. Step S001 is a step of setting a condition necessary for simulation. Step S002 is a step of generating a link structure for connecting adjacent droplets based on the arrangement information of the droplets of the curable composition IM set in step S001. Steps S001 and S002 may be understood as one step obtained by combining steps S001 and S002, for example, as a preparation step. Step S003 is a step of computing the motion of the mold M and updating the position of the mold M. Step S004 is a step of computing, based on the position information of the mold M updated in step S003, a behavior in which each droplet of the curable composition IM is spread. Step S004 can include a step of determining merging (connection) of the spread droplets. Step S005 is a step of determining whether each link of the link structure is closed. Step S006 is a step of computing the flow of a gas flowing among the droplet components, and calculating the pressure distribution of the gas. Step S007 is a step of determining, in accordance with updated opening/closing information of the link, whether a bubble is trapped among the droplets. In step S008, it is determined whether the time in computation has reached an end time. If the time has not reached the end time, the time advances to a next time, and the process returns to step S003; otherwise, the simulation method ends. Note that the simulation apparatus 1 may be understood as an aggregate of hardware components that execute steps S001, S002, S003, S004, S005, S006, S007, and S008, respectively.

In step S001, parameters necessary for simulation are set. The parameters can include the arrangement of the droplets of the curable composition IM on the substrate S, the volume of each droplet, the physical properties of the curable composition IM, information concerning unevenness (for example, information of the pattern of the pattern region PR) of the surface of the mold M, and information concerning unevenness of the surface of the substrate S. The parameters can include a time profile of a force applied to the mold M by the mold driving mechanism MD, and a profile of a pressure applied to the space SP (mold M) by the pressure control unit PC.

Figure 4:
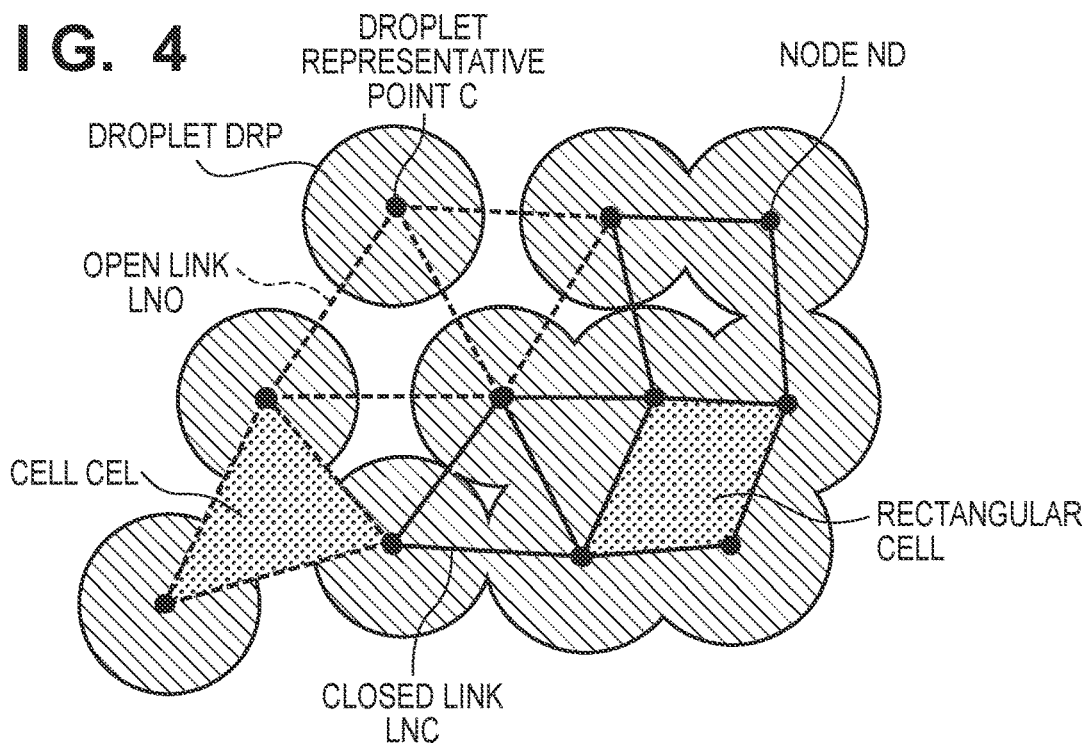
FIG. 4 is a view for explaining a concept of a link structure.

In step S002, a link structure for connecting adjacent droplets is generated based on the arrangement information of the droplets of the curable composition IM. The link structure will be described with reference to FIG. 4. A model expressing each droplet of the curable composition IM is represented as a droplet component DRP. A node ND is generated at a representative point as a point indicating the representative position of the droplet component. A link is created by connecting adjacent nodes. More specifically, a link is generated for nodes generated on droplet components existing so close to each other that they can merge, and can be defined as a line segment connecting the nodes. In addition, if two droplet components forming a link merge with each other, the link is called a closed link LNC; otherwise, the link is called an open link LNO. When a link is indicated without distinguishing between a closed link and an open link, the link is represented as a link LN. Links LN are generated to intersect each other at the nodes ND and not to intersect each other in portions other than the nodes.

A minimum unit region of a closed region formed by a plurality of links will be referred to as a cell CEL hereinafter. One cell corresponds to one bubble trapped among the droplets in a process of forming a film of the curable composition IM. The cell is typically a triangle but can also be defined as a polygon with four or more sides. A representative point can be defined for each cell. Since, as described above, one cell corresponds to one bubble, it is desirable to define the representative point position of each cell so as to correspond to a position at which a bubble is generated. For a triangular cell, a representative point can be set at the circumcenter, that is, the center of a circumscribed circle. As the advantage of adopting the circumcenter, the circumcenter is a point equidistant from three nodes forming the cell, and corresponds well to a position at which a bubble is actually trapped. On the other hand, for a polygonal cell forming a polygon with four or more sides, a barycenter of the coordinates of all nodes forming the cell can be defined as a representative point.

Figure 5:
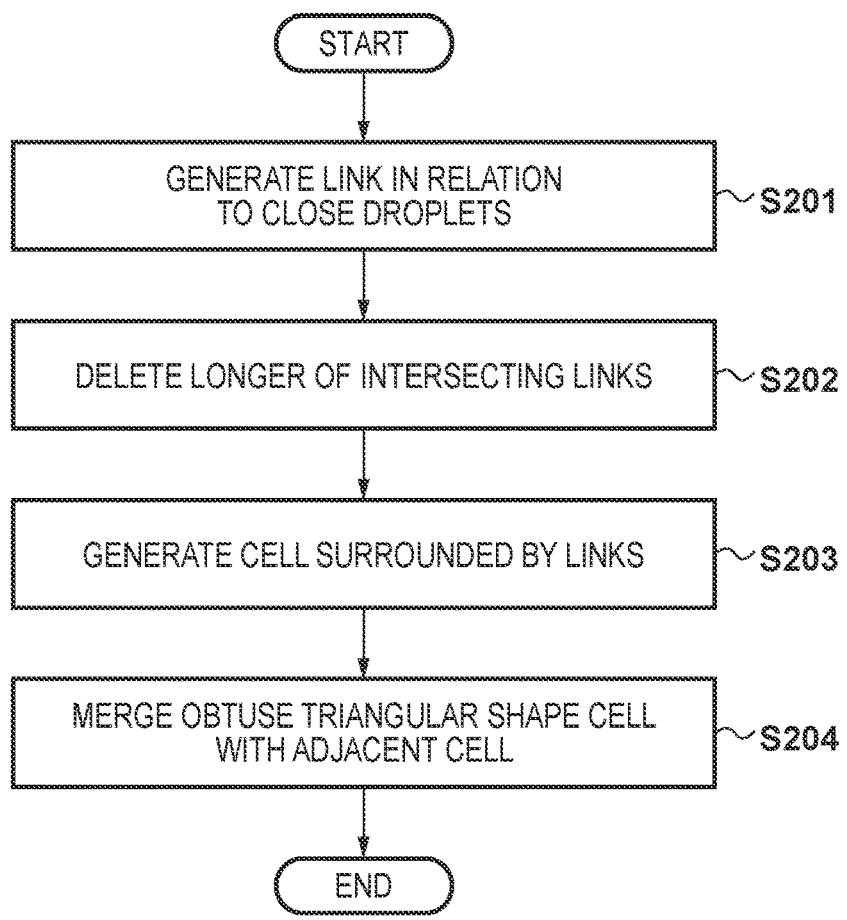
FIG. 5 is a flowchart of a link structure generation process.
Figure 6:
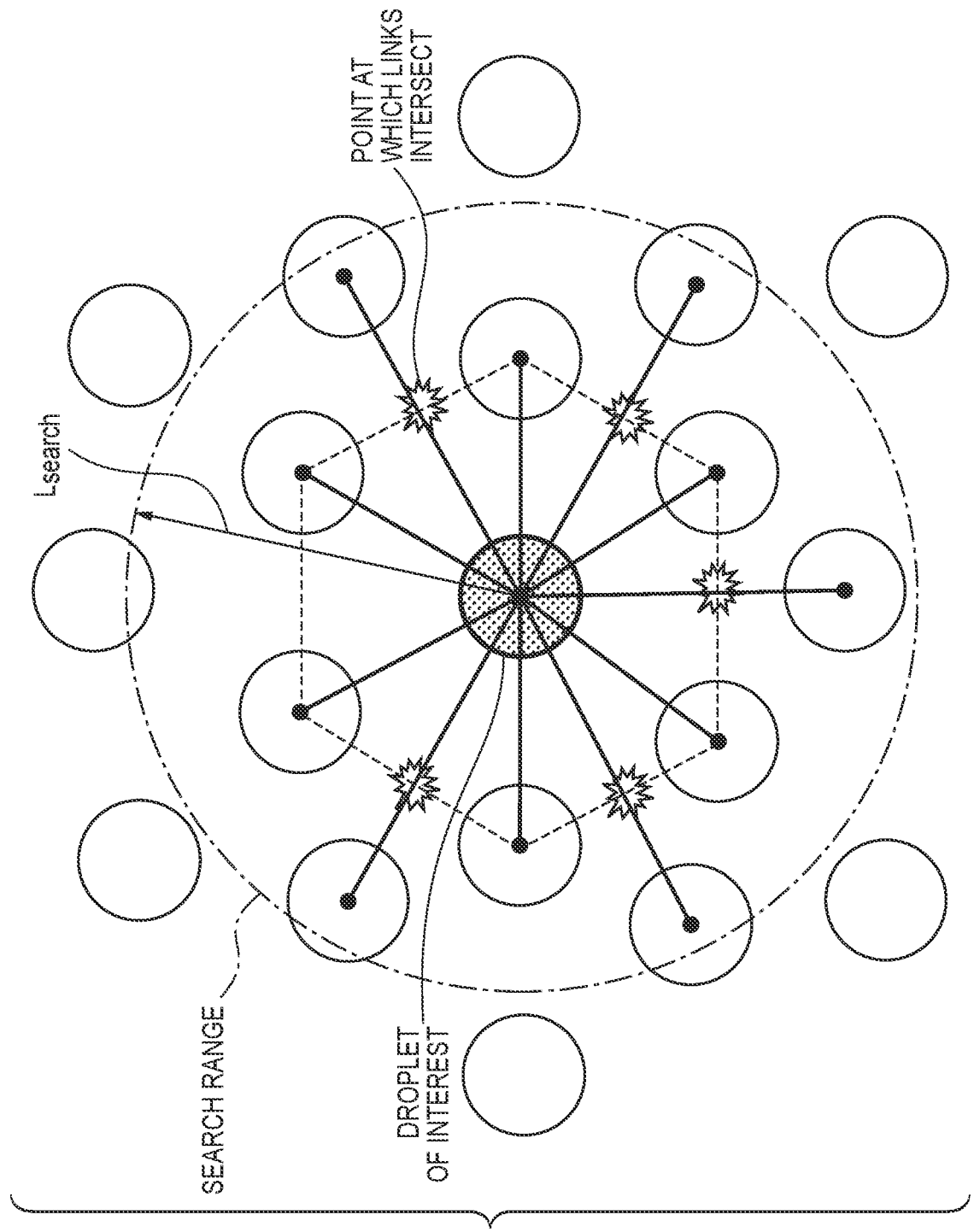
FIG. 6 is a view showing the relationship between a droplet and a search range.

A plurality of methods of generating a link structure can be considered. One example will be described with reference to FIG. 5. Assume that the arrangement information of the droplets is already acquired in step S001 of FIG. 3. Step S201 is a link generation step of generating a link by connecting nodes existing close to each other. "Close" indicates a region within a predetermined search distance from a node at, for example, the center of a droplet of interest. The search distance is represented by $L_{search}$. The search distance $L_{search}$ is to be selected to include droplets that can merge with each other in a process of forming a film of the curable composition as a final product. For example, when $h_{RLT}$ represents the average thickness of the liquid film of the curable composition IM and $V_{drop}$ represents the average volume of the droplet, the search distance $L_{search}$ is given by:

$$L_{search} = \alpha \sqrt{V_{drop} / \pi h_{RLT}}$$

where α represents a safety factor, and has a numerical value of 1 or more. As α is larger, omission of generation of a link can be avoided but a computation cost for link generation increases. FIG. 6 shows an image of a search range.

Figure 7:
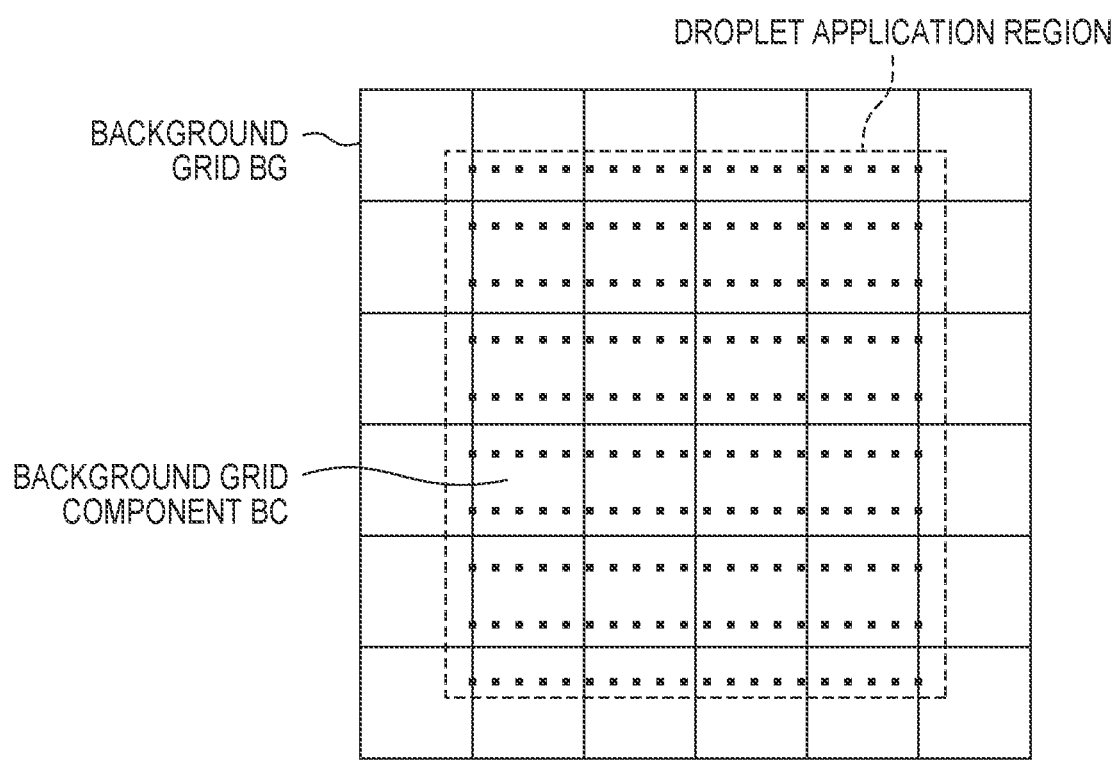
FIG. 7 is a view showing an example of a background grid used when generating a link structure.

In the above neighborhood search step, with respect to a droplet of interest, distance computation may be executed for the remaining droplets, and it may be determined whether the distance is equal to or shorter than $L_{search}$. However, in this method, as the total number of droplets is larger, a longer time is taken to execute a search. To speed up the neighborhood search step, a method of defining a background grid to be described below can be adopted. The background grid indicates a grid obtained by dividing a region including a droplet application region by a rectangular grid, as shown in FIG. 7, and is denoted by BG. Furthermore, one component of the background grid is represented by a background grid component BC. For each background grid component BC, droplets each having a droplet center included in the background grid component BC are registered. The size of the background grid needs to be selected at least so that one background grid component includes a plurality of droplets and the size is larger than the search distance $L_{search}$. Since for pairs of droplets included in the background grid components which have one or more background grid components therebetween, it is known in advance that the distances are sufficiently long, such droplets may be excluded from the search range. Since it is enough to execute a search for pairs of droplets included in the adjacent background grid components, the neighborhood search time can be reduced significantly.

Depending on the value of the safety factor α, the links generated in this step can intersect each other. If there exist the links intersecting each other, inconvenience occurs in the subsequent simulation method, and it is thus necessary to delete such links. By registering the generated links in the above-described background grid BG, similar to the droplets, it is possible to execute a link search in next step S202 with a low computation cost.

Step S201 is repeatedly performed while changing the droplet of interest. If step S201 is repeatedly performed while changing the droplet of interest, intersecting links can be generated, as shown in FIG. 6. To cope with this, in step S202, it is determined for all pairs of links whether the links intersect each other, and a longer link of the pair of links which are determined to intersect each other is deleted. For a pair of links which are sufficiently separated, it can be determined in advance that the links do not intersect each other, and it is thus possible to skip the above determination processing. If the links are registered in the background grid BG, such pair can readily be removed from the search list. Upon completion of this step, there are no links intersecting each other.

Step S203 is a cell generation step of generating a cell for a minimum region surrounded by a plurality of links. In the typical droplet arrangement, triangular cells are mainly generated. For some regions, polygonal cells (with four or more sides) may be generated at this time. In accordance with the droplet arrangement, a cell having an obtuse triangular shape can be generated. For the obtuse triangular cell, inconvenience can occur when obtaining the area ratio of the curable composition IM in the cell.

Figure 8:
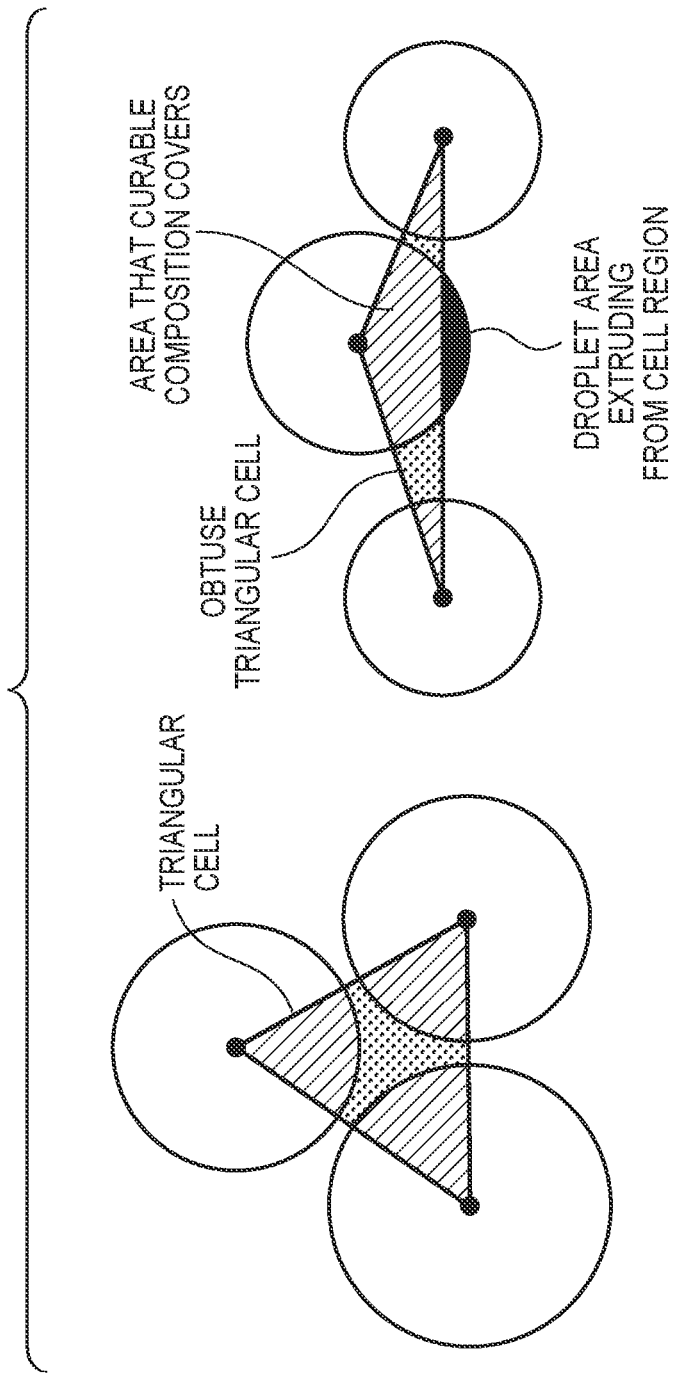
FIG. 8 is a view for explaining a problem that can arise in an obtuse triangular cell.
Figure 9:
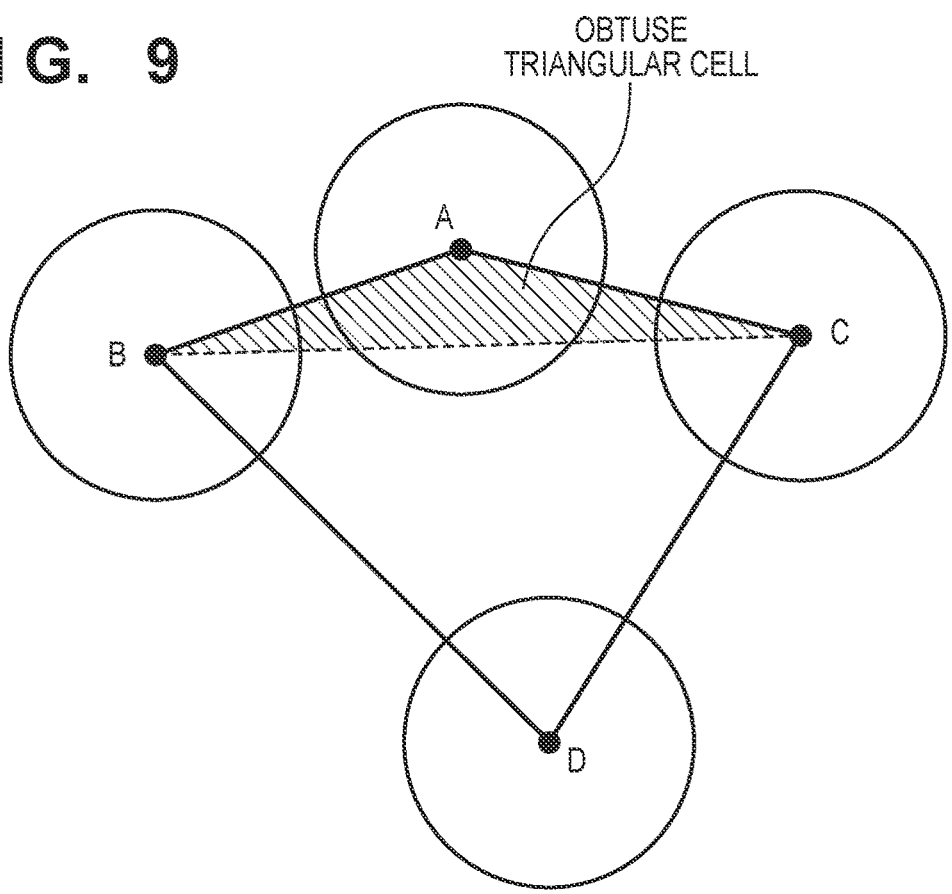
FIG. 9 is a view showing a state in which the obtuse triangular cell is merged with an adjacent cell.

In step S204, the generated obtuse triangular cell is merged with an adjacent cell. As shown in FIG. 8, a droplet corresponding to a node with an obtuse angle may extrude from an opposing link (a solid portion in FIG. 8). Therefore, a computation method of calculating a hatched area in FIG. 8 is complicated, and the computation cost may also increase. If the cell has the obtuse triangular shape, the above problem is avoided by merging the cell with an adjacent cell on the opposite side of the vertex of the obtuse angle. A method for this will be described by exemplifying FIG. 9. An obtuse triangular cell ABC with a vertex A of an obtuse angle is merged with an adjacent cell BCD sharing a link BC facing the vertex A. The adjacent cell may be a polygonal cell. This operation is performed for all obtuse triangular cells.

By executing steps S201 to S205 described above, a link structure to be used by the simulation method can be generated. The link structure may be generated by a method other than the above method. For example, a method using the Delaunay method or the like can be used.

In step S003, the position of the mold M is updated. The position of the mold M can be calculated by solving an equation of motion. The equation of motion can include a fluid force received from the curable composition IM and acting on the mold M, a pressure received from the flow of a gas existing in the space between the mold M and substrate S, the inertial force of the mold M, a load acting on the mold holder MH of the mold, and a restoring force accompanying elastic deformation of the mold M. The position of the mold M may be updated by inputting the position information of the mold M computed in advance for each time, and using the information having undergone interpolation.

In step S004, a behavior in which each droplet component on the substrate S is spread by the motion of the mold M, that is, along with the advance of contact between the second member and the plurality of droplets of the curable composition is computed. A method of computing the spreading of each droplet is desirably a method in which the contour shape of each droplet is accurately obtained. Step S004 can include a step of determining, for each link forming a cell, whether droplets forming the link merge each other. In this step, a method can desirably, accurately determine the presence/absence of merging of the droplets. For example, a method of representing each droplet component by its contour shape can be considered. When each droplet is spread by the mold M, the volume of the curable composition IM is saved. For this reason, a method of predicting the change of the spreading shape of the droplet by an approximation without division by a computational grid can be adopted. This method or the like is preferably used in combination with the present invention since it can be expected to significantly reduce the computation time. On the other hand, in the general fluid simulation method or the like including a step of dividing an analysis region by a computational grid, the computation time is very long. However, if a computation result can be obtained within a realistic time, for example, if an analysis region is sufficiently small, the general method can be used in combination with the present invention, as a matter of course.

Figure 10:
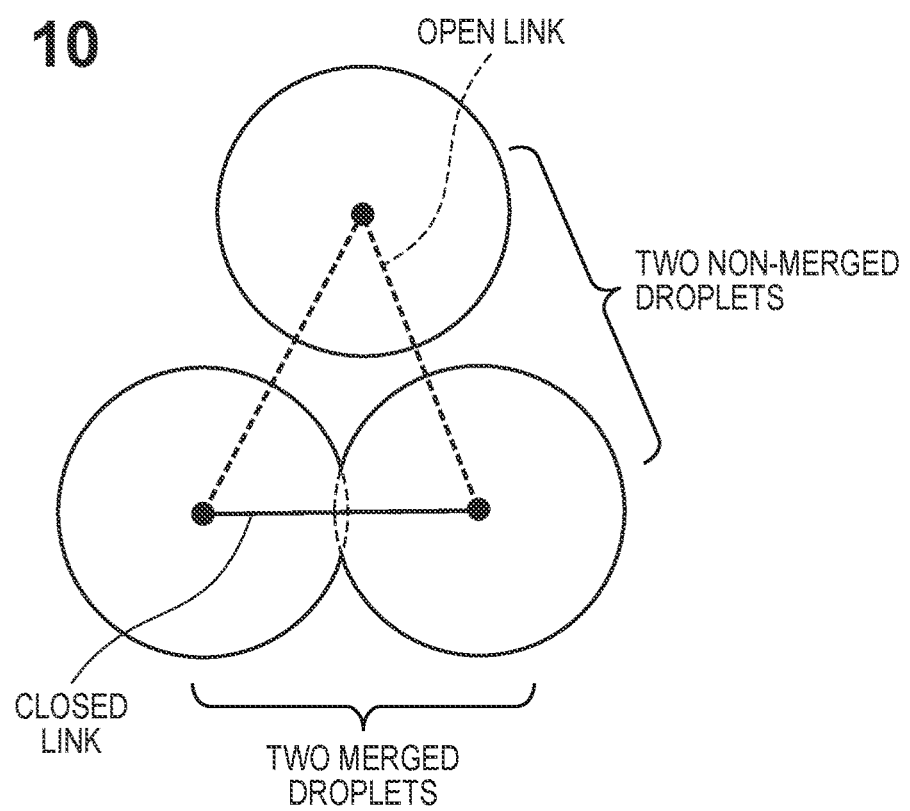
FIG. 10 is a view for explaining a method of determining a closed link and an open link.

After the computation step of step S004, steps S005, S006, and S007 are executed. Step S005 is a link determination step of determining opening/closing for all the links LN. In this step, for each link forming a cell, the link is determined as an open link if droplets forming the link do not merge each other, and the link is determined as a closed link if the droplets forming the link merge each other. The opening/closing determination method will be described with reference to FIG. 10. If two droplets forming each link merge each other, the link is determined to be closed, and determined as the closed link LNC. On the other hand, if the two droplets do not merge each other, the link is determined as the open link LNO. In step S006, the flow of a gas existing between the droplets is computed. As a result, the pressure distribution of the gas is computed. In step S007, based on the opening/closing of each link determined in step S005, it is determined whether a bubble is formed in each cell. If it is determined that the bubble is formed, a volume $V_{bub}$ of the bubble can be calculated, as follows. That is, the volume $V_{bub}$ can be calculated by multiplying an amount obtained by subtracting the area of the curable composition IM in the cell of interest from the area of the cell by the distance between the mold M and the substrate S at the computation time when it is determined that the bubble is formed.

Figure 11:
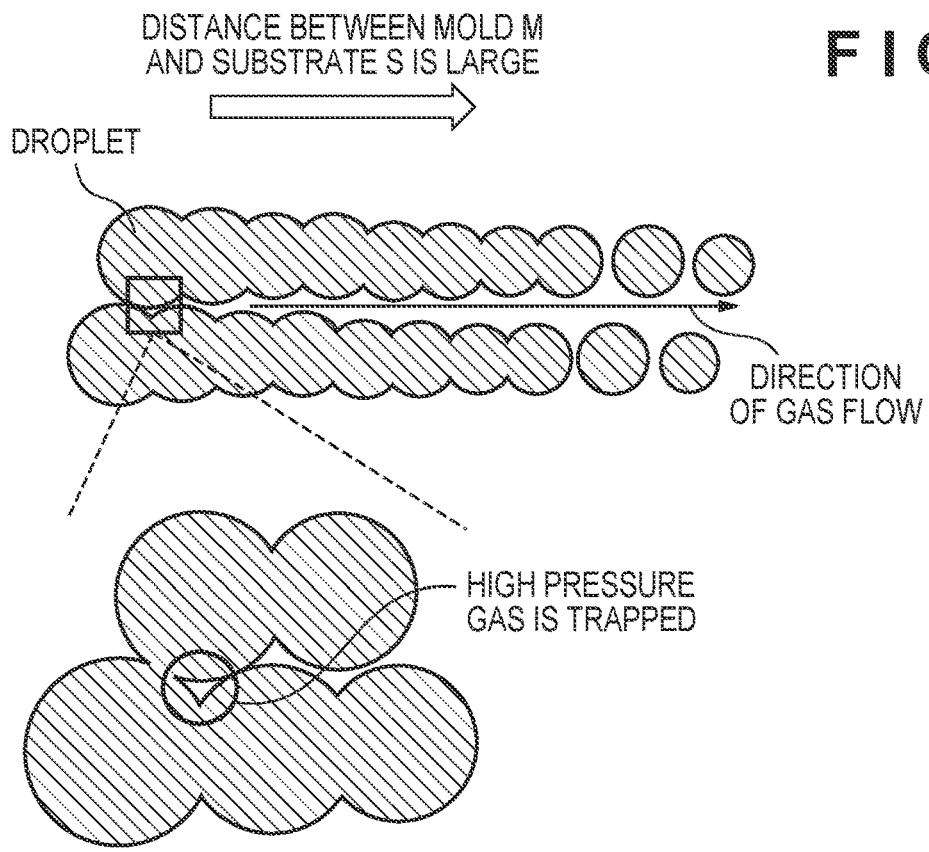
FIG. 11 is a view for explaining the relationship between the pressure and the flow of a gas among droplets.

In step S006, the flow of the gas between the droplets is computed. When the droplets are pressed by the mold M to merge each other, the channel of the gas can typically be formed, as shown in FIG. 11. If the channel is formed, the gas flows through the narrow region, thereby causing a large pressure loss. Then, a pressure $P_{bub}$ in a trapped bubble on the left side in FIG. 11 increases. The number $n_{bub}$ of gas molecules in the bubble is represented using the pressure $P_{bub}$ and the volume $V_{bub}$ of the bubble by:

$$n_{bub} = \frac{p_{bub}V_{bub}}{RT} \tag{0}$$

where R represents a gas constant and T represents a temperature. As described above, the number of gas molecules is computed as an amount proportional to the product of the pressure of the gas in the bubble and the volume of the bubble. It is determined that as the number $n_{bub}$ of gas molecules is larger, a bubble defect more easily remains after a predetermined time elapses. Therefore, in the simulation method, the pressure distribution of the gas in the shot region is calculated and the number $n_{bub}$ of gas molecules in the trapped bubble is computed, thereby using $n_{bub}$ as an index for determining the presence/absence of a bubble defect.

Figure 12:
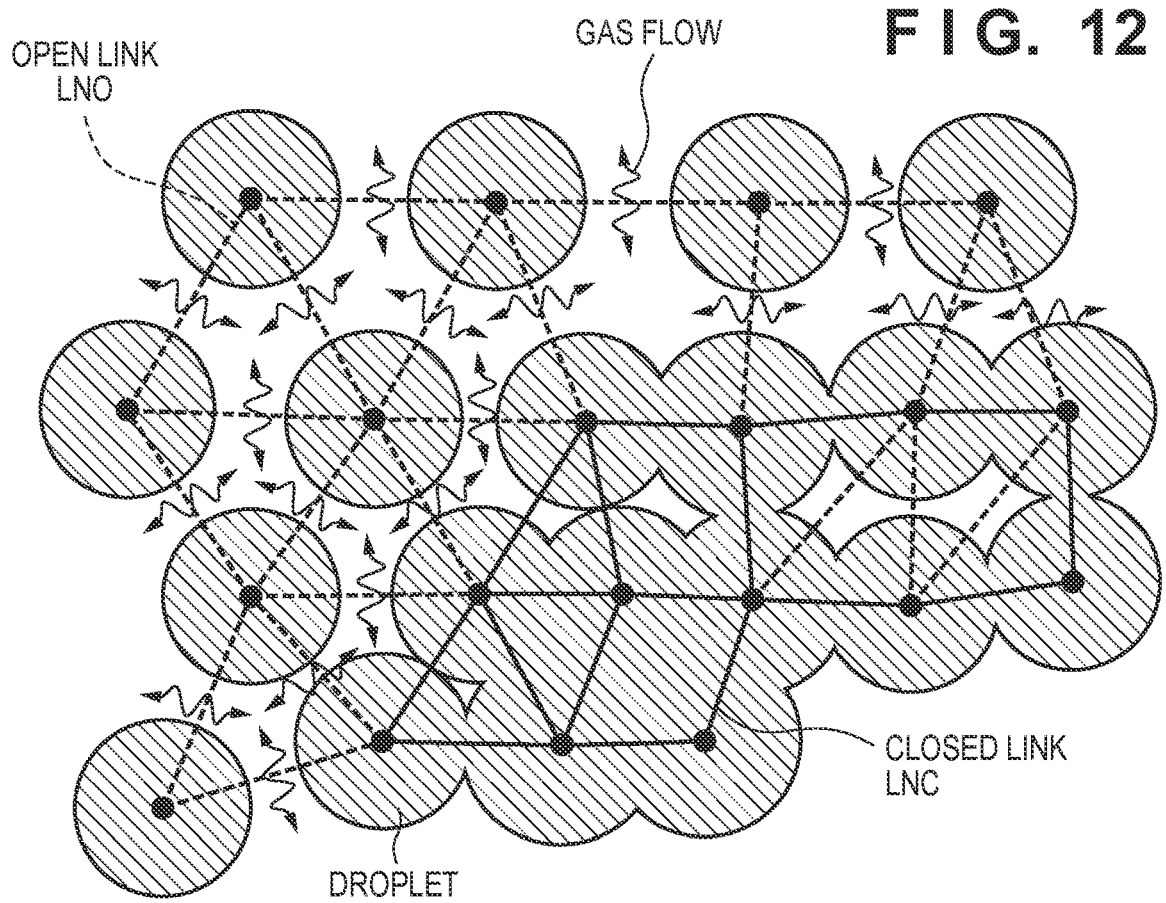
FIG. 12 is a view for explaining gas flow computation on the link structure.
Figure 13:
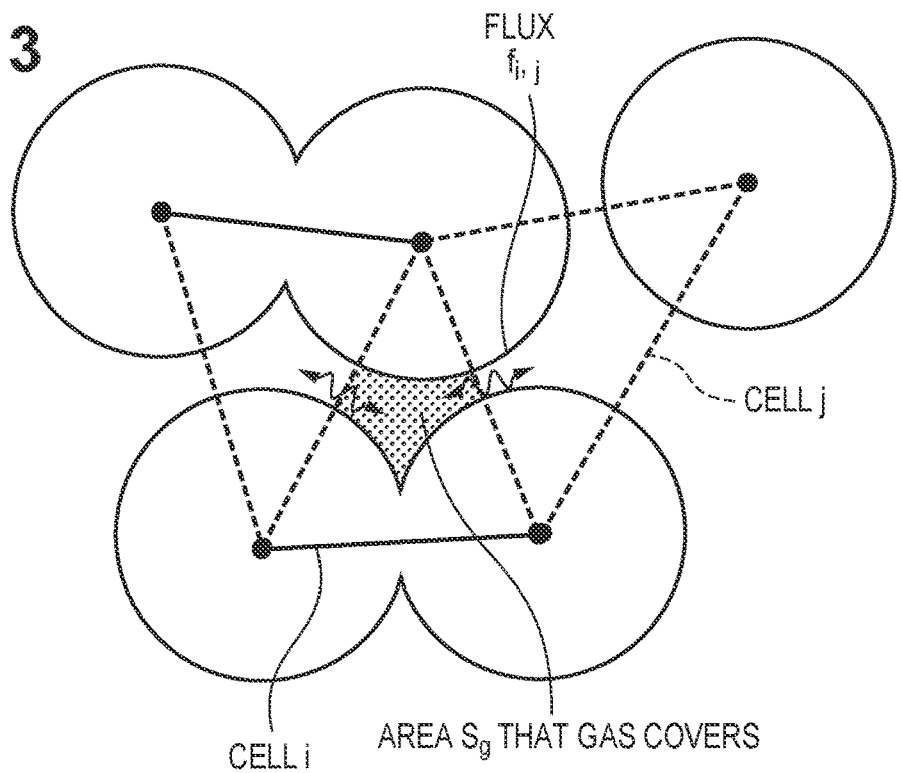
FIG. 13 is a view for explaining a flux in gas flow computation.

The method of computing the pressure of the gas will be described below. For each cell of the link structure generated in step S002, a parameter p representing the pressure of the gas is defined. As shown in FIG. 12, it can be considered that the gas flows between two cells sharing an open link. On the other hand, it can be considered that the gas does not flow between two cells sharing a closed link. Therefore, an equation representing the flow of the gas can be given by:

$$\frac{\partial}{\partial t}(ph) + \nabla \cdot q = 0 \tag{1}$$

where h represents the distance between the mold M and the substrate S at each cell position, that is, a channel height, and q represents the flux of the gas between the cells. As described above, the equation is solved so that q becomes 0 between the cells sharing the closed link. In the film forming apparatus IMP, the mold M is typically pressed against the substrate S up to a distance short enough, as compared with the dimensions of each droplet. The thickness of the gas channel is sufficiently small with respect to the length of the channel. Therefore, it is possible to apply the lubrication approximation to the above equation of the flow. Then, the flux q can be given by:

$$q = -\frac{h^2}{12\mu}Qph\nabla p \tag{2}$$

where $\mu$ represents the viscosity of the gas, and Q represents the correction coefficient of a viscous resistance. The correction coefficient Q can be represented as a function of the channel height h, and has a larger value as the channel height h is smaller. A discrete equation is obtained by integrating equation (1) for each cell area. By integrating equation (1) for an ith cell CELi, equation (3) below is obtained.

$$\frac{\partial}{\partial t}(p_i S_{g,i} h_i) + \sum_j f_{i,j} + f_{i,out} = 0 \tag{3}$$

where $p_i$ and $S_{g,i}$ represent the pressure of the gas and the area of the gas in a cell i, respectively, $h_i$ represents a channel height in the cell i, and $f_{i,j}$ represents the flux of the gas from the cell i to an adjacent cell j. The formula of $f_{i,j}$ can include an effect that as the area ratio of the curable composition IM to the cell increases, the channel width of the gas flowing between the droplets becomes narrower. $f_{i,out}$ represents the flux of the gas other than the flow of the gas between the cells in the cell i. An example of the flux can be a flux when the gas permeates/dissolves in the mold M, the substrate S, and the curable composition IM. By solving equation (3) for $p_i$, the pressure distribution of the gas can be calculated.

An amount obtained by summing up the amounts $f_{i,out}$ at respective computation times, each indicated in equation (3) and corresponding to the flux of the gas permeating/dissolving in the mold M, the substrate S, and the curable composition IM can additionally be stored as $n_{sol}$ in a memory. In a given cell, as this amount is estimated to be larger, a bubble defect at this position tends to more easily remain in correspondence with dissolving of more gas molecules during the contact step. Therefore, in addition to $n_{bub}$, $n_{sol}$ can be used as an index for determining the presence/absence of a bubble defect.

By using the above-described method, the number of unknown numbers of a simultaneous equation to be solved is only the total number of cells. The number of generated cells is almost equal to the number of droplets included in the shot region. This is a significantly small number, as compared with the number of computational components necessary for the computation method by the general fluid simulation, that is, the number of unknown numbers. Therefore, by using this simulation, it can be expected to obtain a computation result within the realistic time.

Figure 14A:
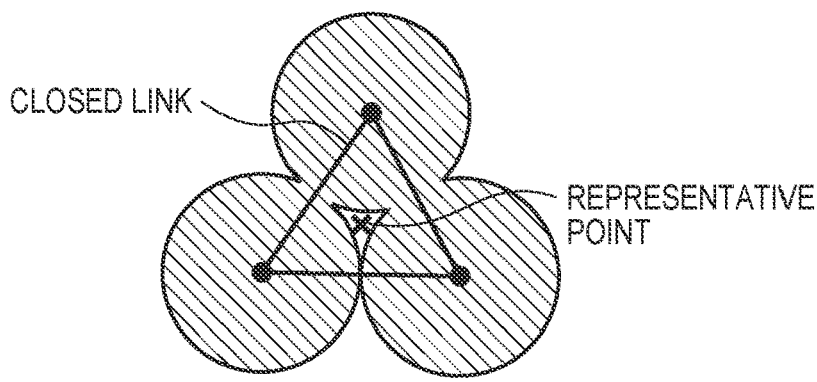
FIGS. 14A and 14B are views each showing a timing of trapping of a bubble.
Figure 14B:
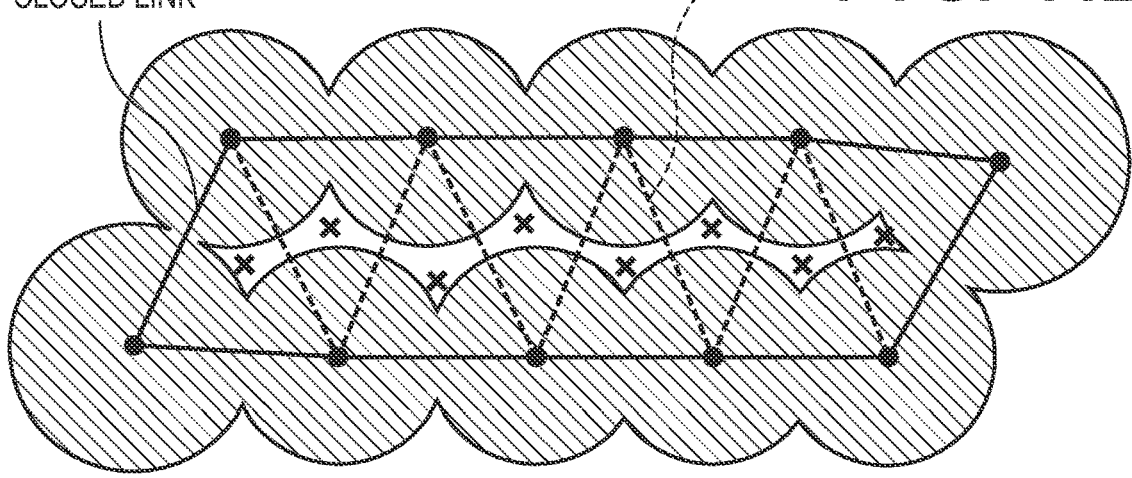

Step S007 is a bubble determination step of determining, based on the presence/absence of merging of droplets corresponding to each link forming a cell, whether a bubble is formed in the cell. In step S007, if a closed region is formed by a plurality of adjacent closed links, it is determined that bubbles are formed in all cells included in the closed region. FIG. 14A shows a typical example. FIG. 14A shows a case in which all links forming a cell are closed links, and it is determined that a closed region is formed by the three closed links and a bubble is formed in one cell included in the closed region. In another case, as shown in FIG. 14B, the condition shown in FIG. 14A is not satisfied for each cell but the plurality of cells are surrounded by closed links at the same time. In the case shown in FIG. 14A, determination can be made for each cell by checking whether all the links forming the cell are closed links. To the contrary, in the case shown in FIG. 14B, determination cannot be made by only one cell, and global information including the periphery is required.

Referring to FIG. 14B, a closed region is formed by the plurality of adjacent closed links. In this case, it is determined that bubbles are formed in all the cells included in the closed region. In this case, determination is made by checking whether a gas region of a cell of interest communicates with the outside of the shot region. Although a plurality of methods of determining the presence/absence of communication can be considered, a method using an undirected graph search algorithm can be applied. The method will be described with reference to FIG. 15. FIG. 15 shows, as an example, a system in which rectangular cells are arranged in a grid pattern. A broken line segment indicates an open link and a thick solid line indicates a closed link. A solid circle represents the representative point of each cell. A hatched cell is a cell which is known in advance to communicate with a gas region (ambient) outside the imprint region, and will be referred to as an ambient communicating cell hereinafter. For example, a cell contacting the periphery of the shot region or the like corresponds to an ambient communicating cell. The gas filling the ambient may be a gas other than air. For example, the gas filling the ambient may be an inert gas that is used as a measure against oxygen effect inhibition, a condensable gas that is used instead of air to promote the disappearance of bubbles, and the like. An undirected graph structure can be generated on the set of representative points of the cells. A graph can be generated by connecting the representative points of cells facing each other with respect to the open link. Referring to FIG. 15, a side is indicated by a thin solid line. As for sets of vertices and sides generated in this way, the respective sets which are not connected to each other will be referred to as graphs hereinafter. A search algorithm is applied to each graph and it is determined whether the graph is connected to the ambient communicating cell. If connection to the ambient communicating cell is confirmed, all cells belonging to the graph are determined as cells in each of which no bubble is formed. To the contrary, all cells belonging to the graph which is not connected to the ambient communicating cell are determined as cells in each of where a bubble is formed. Cells indicated by triangles in FIG. 15 correspond to those cells. Based on this method, determination can be performed at the same time also in the case shown in FIG. 14A. As a method of determining the presence/absence of a bubble, a method other than the above-described method may be adopted.

In step S007, determination information of trapping of a bubble can be stored in the memory for each cell. If it is determined for the cell i at a given computation time that a bubble is trapped, a current computation time $t_{trap,i}$, the pressure $p_i$ of the gas in the bubble of the cell i, and a volume $v_{bub,i}$ of the bubble can be stored. By substituting $p_i$ and $V_{bub,i}$ into equation (0), the number $n_{bub,i}$ of gas molecules in the bubble generated in the cell i can be calculated.

A computation step including steps S003, S004, S005, S006, and S007 is executed for a plurality of preset times. The plurality of times can arbitrarily be set within a period from a time when the mold M starts to lower from the initial position until a time when the mold M contacts a plurality of droplets, the plurality of droplets are crushed to spread, and are connected to each other to finally form one film, and the curable composition should be cured. The plurality of times are typically set at a predetermined time interval.

In step S008, it is determined whether the time in computation has reached the end time. If the time has not reached the end time, the time advances to the next time, and the process returns to step S003; otherwise, the simulation method ends. In an example, in step S008, the current time is advanced by a designated time step, thereby setting a new computation time. Then, if the computation time has reached the predetermined end time, it is determined that computation is complete.

The order of steps S003 to S007 may be changed. For example, if steps S004, S005, S003, S006, and S007 are executed in this order, the position information of the mold M to be used to compute the spreading of each droplet can be processed in the same manner using the value at the previous computation time.

In the above simulation method, for each cell on the generated link structure, the following values are computed and stored in the memory.

Figure 16:
FIG. 16 is a view showing an example of display of a bubble defect distribution.

(1) A time $t_{trap}$ at which a bubble is trapped (2) The number $n_{bub}$ of gas molecules included in the bubble (3) The number $n_{sol}$ of gas molecules dissolving in the substrate S, the mold M, and the curable composition IM at the position of the bubble By using these index values, a bubble defect distribution when an arbitrary time elapses can be calculated. FIG. 16 shows an example of display of the bubble defect distribution. A method of determining the presence/absence of a bubble defect from the index values may use a database acquired from an experiment. A database that summarizes computation results of simulating the dissolution phenomenon of bubbles can be used.

As described above, according to this embodiment, a process in which the respective droplets of the curable composition IM applied onto the substrate S are spread by the mold M, and merge each other to form a liquid film can be computed with a very low cost. In the merging process, for a bubble trapped among droplets, it can be determined whether the bubble remains as a bubble defect by calculating the index value $n_{bub}$ corresponding to the number of gas molecules in the bubble when it is trapped. As a result, it is possible to display, as a two-dimensional image, a position at which a bubble defect remains in the liquid film after a predetermined time elapses since the start of pressing.

The simulation method according to the present invention allows to predict a behavior of the curable composition under a film forming condition, in specific to predict occurrence or non-occurrence of bubbles in the film of the curable composition to be formed under simulated film forming conditions. As an aspect of using a film forming apparatus for forming a film, such simulation method can be used to determine or adjust one or more film forming conditions to be provided by the film forming apparatus for forming the film so as to suppress the occurrence of bubbles in the film to be formed. Such film forming method can be used for producing a cured product.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-109022, filed Jun. 11, 2019, which is hereby incorporated by reference herein in its entirety.

What is claimed is:

1. A method of predicting a behavior of and forming a curable composition in a film forming process, the method comprising:
generating a link by connecting two adjacent representative points of the plurality of droplets;
generating a cell as a closed region formed by a plurality of links; and
determining, based on the presence/absence of merging of droplets corresponding to each link forming the cell, whether a bubble is formed in the cell;
arranging a plurality of droplets of a curable composition on one of a first member and a second member;
bringing the plurality of droplets of the curable composition arranged on one of a first member and a second member into contact with an other of the first member and the second member; and
forming, based on the determining, from the plurality of droplets a film of the curable composition on the first member.

2. The method according to claim 1, further comprising determining, for each link forming the cell, the link as an open link if the droplets forming the link do not merge each other, and the link as a closed link if the droplets forming the link merge each other,
wherein in the determining whether the bubble is formed in the cell, if a closed region is formed by a plurality of adjacent closed links, it is determined that bubbles are formed in all cells included in the closed region.

3. The method according to claim 2, wherein in the determining whether the bubble is formed in the cell, if a graph that connects representative points of cells facing each other with respect to the open link, and the graph is not connected to an ambient communicating cell which is known in advance to communicate with ambient, it is determined that bubbles are formed in the plurality of cells forming the graph.

4. The method according to claim 1, wherein the generating the link includes generating a link by connecting a node which is placed on a representative point of a droplet of interest to each node in a region within a predetermined search distance from the node, and
deleting a longer link of each intersecting pair of links generated by repeating the generation of the link while changing the droplet of interest.

5. The method according to claim 1, further comprising merging, if the cell has an obtuse triangular shape, the cell with an adjacent cell on an opposite side of a vertex of an obtuse angle.

6. The method according to claim 1, further comprising computing a behavior in which each droplet is spread along with advance of contact between the plurality of droplets and the second member,
wherein the determining whether the bubble is formed in the cell is executed after the computing.

7. The method according to claim 1, further comprising calculating the number of gas molecules of a bubble,
wherein the calculated number of gas molecules is used as an index for determining the presence/absence of a bubble defect.

8. The method according to claim 7, wherein
the number of gas molecules is computed as an amount proportional to a product of a pressure of a gas in the bubble and a volume of the bubble, and
the pressure of the gas is computed based on a flow of the gas between the cells occurring via an open link whose droplets do not merge each other.

9. The method according to claim 1, further comprising storing, in a memory, a dissolution amount of the gas in the first member, the second member, and the curable composition before the bubble is formed,
wherein in the determining whether the bubble is formed in the cell, the dissolution amount is used as an index for determining the presence/absence of a bubble defect.

10. A computer-readable storage medium storing a program for causing a computer to execute a simulation method defined in claim 1.

11. A film forming method of bringing a plurality of droplets of a curable composition arranged on one of a first member and a second member into contact with an other of the first member and the second member and forming a film of the curable composition on the first member under a film forming condition provided by a film forming apparatus, the method comprising:
using the simulation method according to claim 1 to predict a behavior of the curable composition under a simulated film forming condition; and
setting a film forming condition to be provided by the film forming apparatus so as to suppress an occurrence of bubbles in the film to be formed.

12. A method of producing a cured product, comprising:
using the film forming method according to claim 11 for forming a film of a curable composition; and
curing the curable composition.

13. A forming apparatus for predicting a behavior of and forming a curable composition, comprising:
a dispenser configured to arrange a plurality of droplets of a curable composition;
one or more processors connected to one or more memories storing instructions, the one or more processors being configured to execute the instructions to cause the forming apparatus to:
generate a link by connecting two adjacent representative points of the plurality of droplets;
generate a cell as a closed region formed by a plurality of links;
determine, based on the presence/absence of merging of droplets corresponding to each link forming the cell, whether a bubble is formed in the cell;
arrange, by the dispenser, a plurality of droplets of the curable composition on one of a first member and a second member;
bring the plurality of droplets of the curable composition arranged on one of a first member and a second member into contact with an other of the first member and the second member; and
form, based on the determining, from the plurality of droplets a film of the curable composition on the first member.

* * * * *